United States Patent
Vashchenko

(10) Patent No.: US 8,536,679 B2
(45) Date of Patent: Sep. 17, 2013

(54) HIGH HOLDING VOLTAGE BJT CLAMP WITH EMBEDDED REVERSE PATH PROTECTION IN BCD PROCESS

(75) Inventor: Vladislav Vashchenko, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 16 days.

(21) Appl. No.: 12/807,095

(22) Filed: Aug. 27, 2010

(65) Prior Publication Data

US 2012/0049326 A1   Mar. 1, 2012

(51) Int. Cl.
  *H01L 29/66*  (2006.01)
(52) U.S. Cl.
  USPC ............... 257/565; 257/E29.174; 438/328

(58) Field of Classification Search
  USPC ............ 257/565, E29.174, E21.37; 438/328
  See application file for complete search history.

(56) References Cited

U.S. PATENT DOCUMENTS

2004/0089877 A1* 5/2004 Zheng et al. ................. 257/197
2008/0290463 A1* 11/2008 Stecher ........................ 257/565

* cited by examiner

*Primary Examiner* — Vongsavanh Sengdara
(74) *Attorney, Agent, or Firm* — Alan A. R. Cooper; Wade J. Brady, III; Frederick J. Telecky, Jr.

(57) ABSTRACT

In the case of adjacent high voltage nodes in which one node is protected by a lateral BJT clamp, the irreversible burnout due to transient latch-up between the two adjacent high voltage pins of the structure is avoided by increasing the base contact region by including a sinker connected to the base.

5 Claims, 5 Drawing Sheets

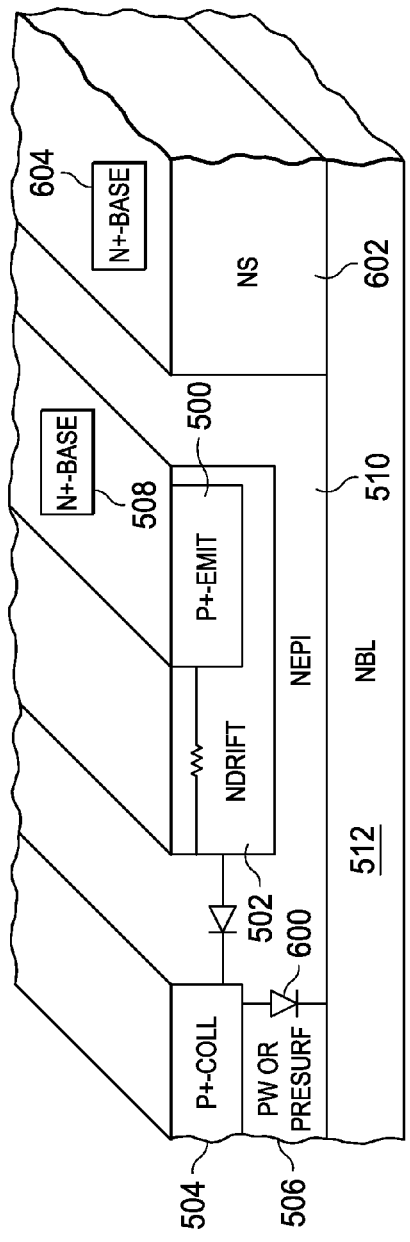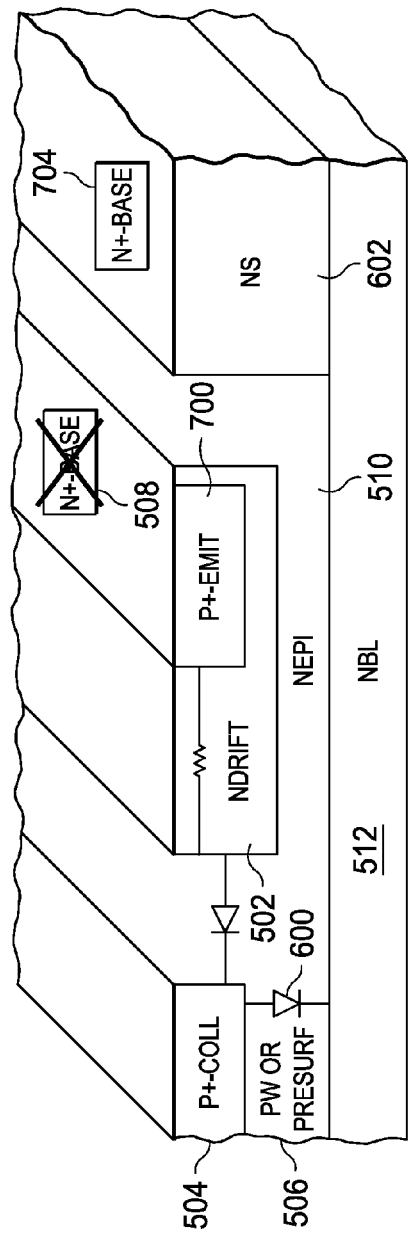

HIGH HOLDING VOLTAGE BJT CLAMP WITH EMBEDDED REVERSE PATH PROTECTION IN BCD PROCESS

FIELD OF THE INVENTION

The invention relates to ESD protection. In particular it relates to n-epi to n-epi lateral latch-up.

BACKGROUND OF THE INVENTION

In high voltage processes it is common to have transient latch-up. For example latch-up current may flow between adjacent high voltage pins protected by high voltage electrostatic discharge (ESD) devices or between the ESD device and internal circuitry.

In particular, in structures where there are n and p laterally spaced regions such as n-type epitaxial (n-epi) regions and p-isolation, a parasitic current path can be created through the lateral parasitic NPN formed by the n-epi regions and p-isolation to provide an n-epi to n-epi transient latchup scenario. This is, for instance found in the case of a BCD process between an NLDMOS-SCR ESD clamp and a laterally arranged PNP clamp. The lateral PNP can also be implemented in an extended voltage CMOS process to define the parasitic NPN.

FIG. 1 shows a circuit diagram of a high voltage control pin 100 and power pin 102. The control pin is protected by an NLDMOS-SCR ESD clamp 110, while the power pin is protected by a high holding voltage lateral PNP ESD clamp 112. During ESD tests the power ground node 114 is floating, which creates variable conditions on the base of the parasitic NPN 120. The NPN 120 is formed by a p-isolation ring 200 (FIG. 2) formed between n-epi regions of the two clamp structures that are separated by the p-isolation ring 200 and that define the collector and emitter of the parasitic NPN. The n-epi regions shown in FIG. 2 are provided with n-sinker epitaxial ties 202, 204.

Depending on internal circuit design and metallization routing, the latch-up current through the parasitic NPN can simply pass to ground through the ESD devices, but in many situations the current causes irreversible burnout of one or both ESD devices.

In order to provide a dual direction current path in an ESD protection circuit, a current path may be defined in the forward direction by an ESD snapback device, and in the reverse direction by a reverse biased diode. In the circuit of FIG. 1, reverse current protection is provided by means of reverse biased diodes 140, 142. These body diodes are often sufficient for the pin protection during high voltage reverse currents. However, if two clamps are placed adjacent to each other with minimum isolation rules, the total voltage between two high voltage pins may exceed the parasitic NPN turn-on voltage, especially in the case of fast transient modes e.g. due to excessive reverse path diode voltage drop.

SUMMARY OF THE INVENTION

According to the invention there is provided a method of reducing the risk of irreversible burnout due to transient latch-up between two adjacent high voltage pins of a structure in which one pin is protected in the forward direction by a lateral BJT that includes at least one collector finger, at least one emitter finger and a base, and that defines an embedded reverse path body diode, comprising increasing the efficiency of the reverse path body diode by increasing the base-contact area of the lateral BJT. The increasing of the base contact area of the BJT may comprise at least one of forming an enlarged base contact island to the base of the lateral BJT, adding additional base contact islands, and insofar as the structure includes a buried layer of the same doping type as the base of the BJT, adding a sinker epitaxial tie of the same doping type as the base of the BJT that extends down to the buried layer. Insofar as the lateral BJT includes a sinker epitaxial tie the method may further comprise eliminating any base contact islands.

Further, according to the invention, there is provided a lateral BJT clamp for protecting a high voltage pin that is arranged adjacent another high voltage pin, comprising at least one collector finger, at least one emitter finger, a base, a buried layer of the same doping type as the base, and a sinker extending downward toward the buried layer, of the same doping type as the base. The clamp may further comprise at least one base contact island. An enlarged base contact island may be provided at the end of each emitter finger.

BRIEF DESCRIPTION OF THE DRAWINGS

FIG. 6 is a depiction of one embodiment of a lateral PNP of the invention showing the reverse path diode, FIG. 7 is a depiction of another embodiment of a lateral PNP of the invention showing the reverse path diode.

DETAILED DESCRIPTION OF THE INVENTION

Figure 1:
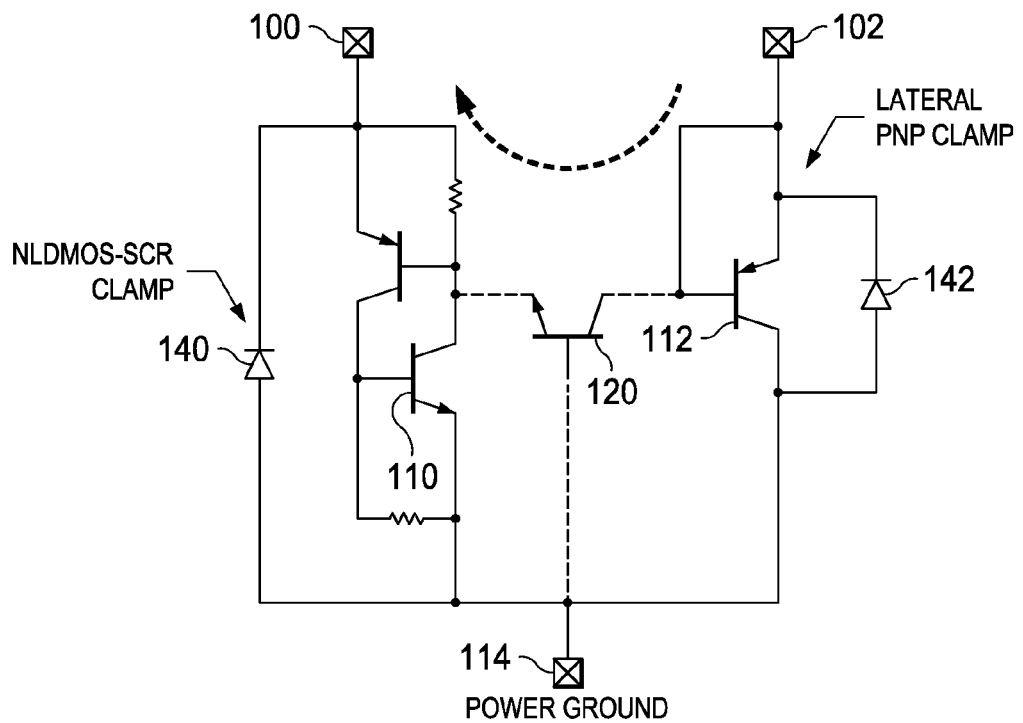
FIG. 1 is a circuit diagram of a prior art ESD protection structure comprising an NLDMOS-SCR clamp and lateral PNP clamp in an BCD process, showing a parasitic NPN transistor.

As mentioned above, if two clamps are placed in close proximity to each other with minimum isolation rules, an alternative current path is produced through the parasitic NPN transistor between them. In the case of a high voltage pin-to-high voltage pin combination the total voltage may exceed the parasitic NPN turn on voltage especially in fast transient mode e.g., due to excessive reverse path diode voltage drop such as the voltage drop across diode 142 in FIG. 1.

In the case of a lateral BJT clamp such as lateral PNP or lateral NPN clamp implemented in a BCD process technology, or implemented in an extended voltage CMOS process, wherein the circuit defines a parasitic NPN the present invention increases the efficiency of the body diode in the lateral BJT by enlarging the base contact area, or by adding base contacts e.g. two or more base contacts, or by adding at least one sinker epi tie of same doping type as the base of the lateral BJT (n-sinker region that extends down into the epitaxial region in the case of an lateral PNP, or p-sinker region in the case of a lateral NPN) to take advantage of the low resistance of the buried layer (NBL in the case of the LPNP or PBL in the case of the lateral NPN) and create a large n-type region for the body diode that defines the reverse current path.

Figure 2:
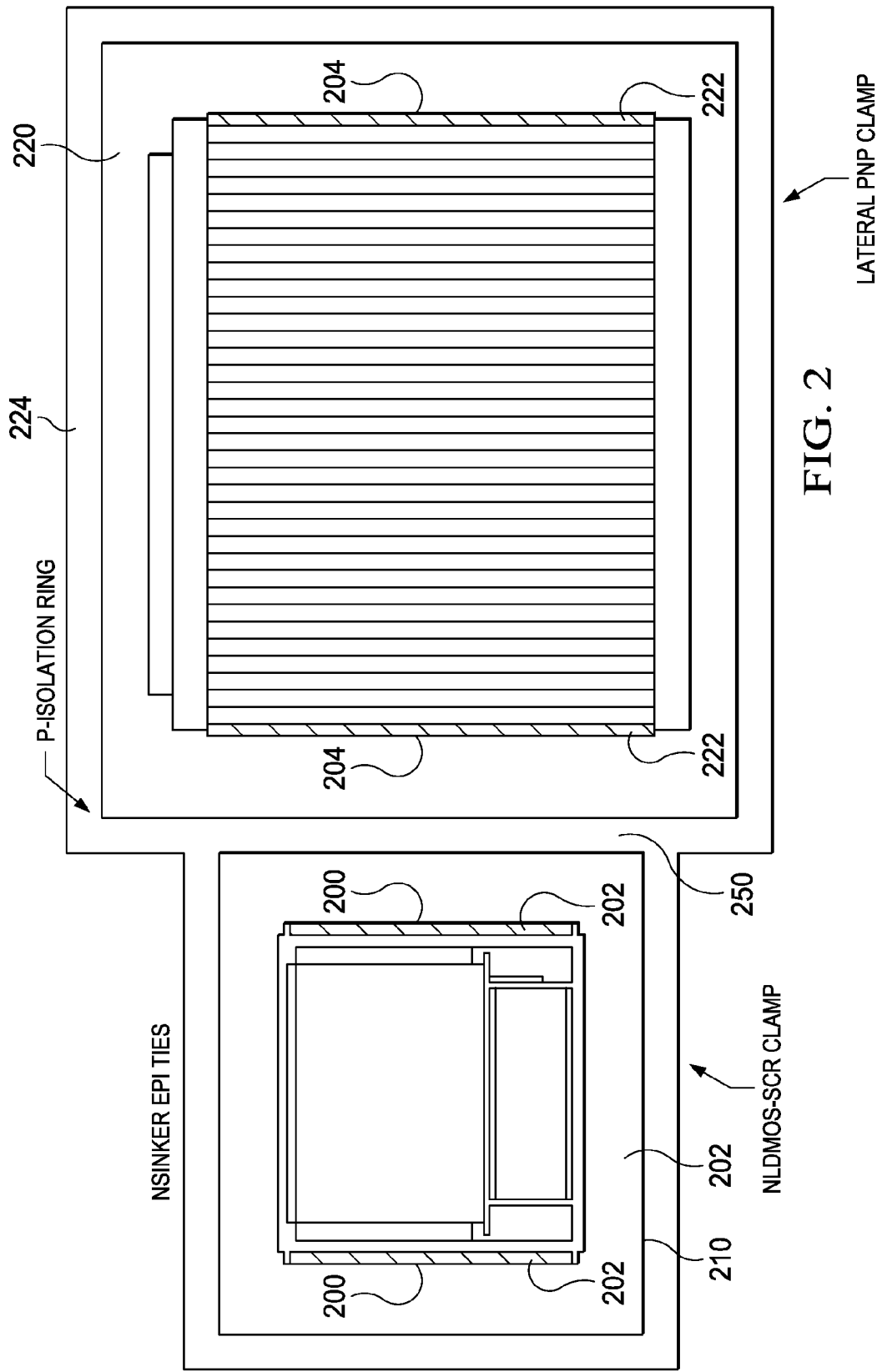
FIG. 2 shows a layout of one embodiment of an ESD protection structure of the invention that includes an NLDMOS-SCR clamp and lateral PNP clamp.

In the embodiment of FIG. 2, the n-sinker epi tie comprises two n-sinkers 200 extending along two sides of the NLD-MOS-SCR clamp 202, which includes a p-isolation ring 210 extending around it. A lateral PNP transistor 220 also includes two n-sinkers 222 in accordance with one embodiment of the invention. The lateral PNP includes a p-isolation ring 224 extending around it. The p-isolation rings 210, 224 form an isolation region 250 between the two clamps (NLDMOS-SCR 202 and the LPNP 220) to define the base of a parasitic NPN. The NPN includes an n-epi drain and an n-epi emitter as defined by the epi regions of the NLDMOS-SCR clamp 202 and the lateral PNP clamp 220.

Figure 4:
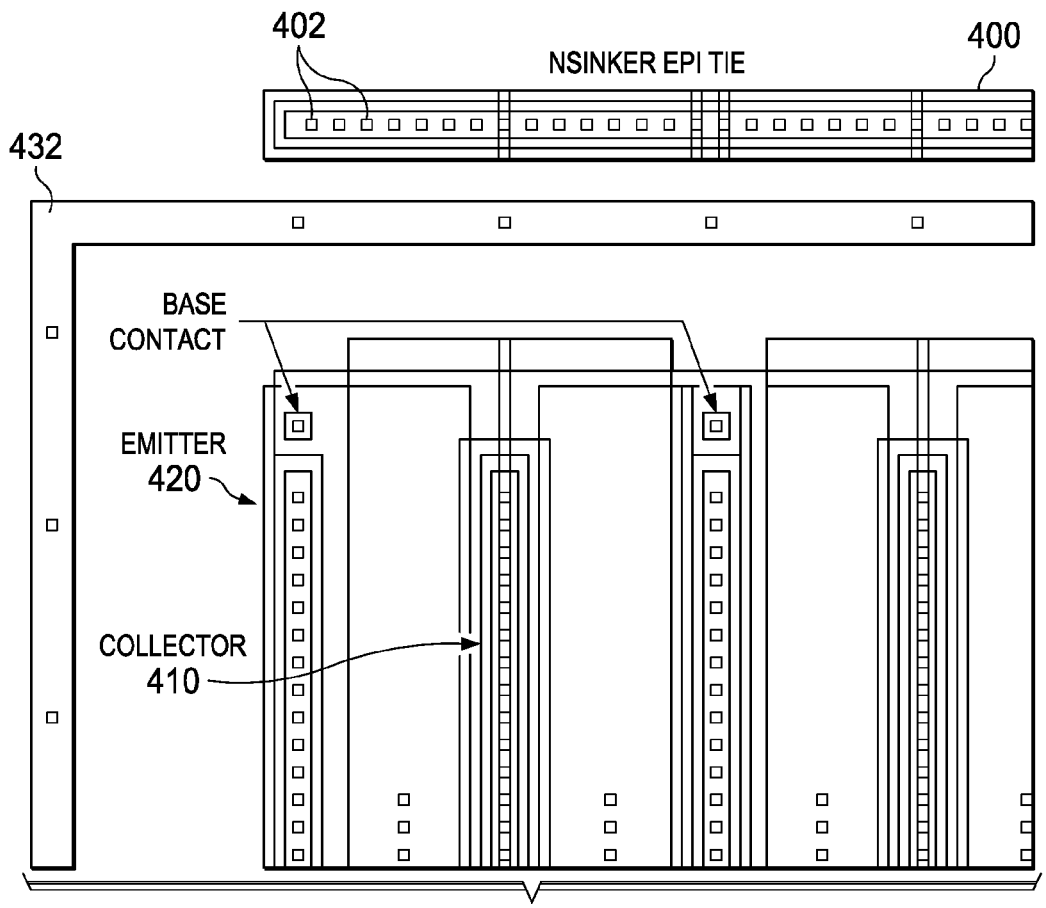
FIG. 4 shows a detailed view of part of one embodiment of a clamp of the invention.

Another embodiment of the invention is shown in FIG. 4, which shows an n-sinker epi tie comprising an n-sinker 400 with multiple contacts 402. In this embodiment the n-sinker epi tie extends perpendicular to the direction of the collector and emitter regions 410, 420. A p-isolation ring 430 is shown extending around the collector and emitter regions and the bases 432.

Figure 3:
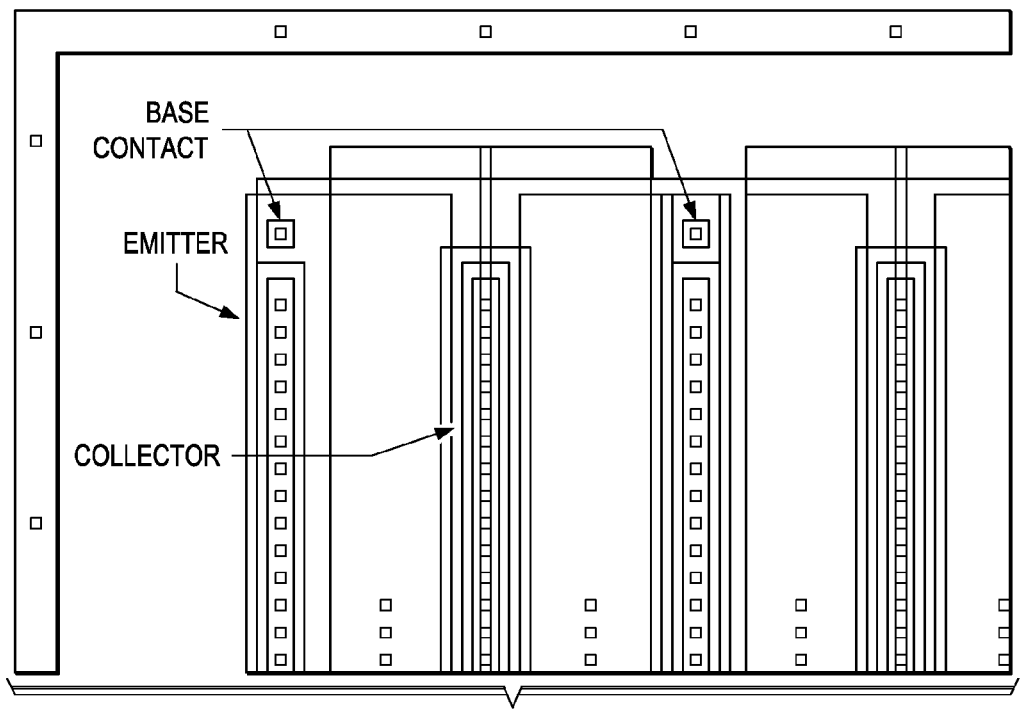
FIG. 3 shows a detailed view of part of a prior art clamp with regular base connection.
Figure 5:
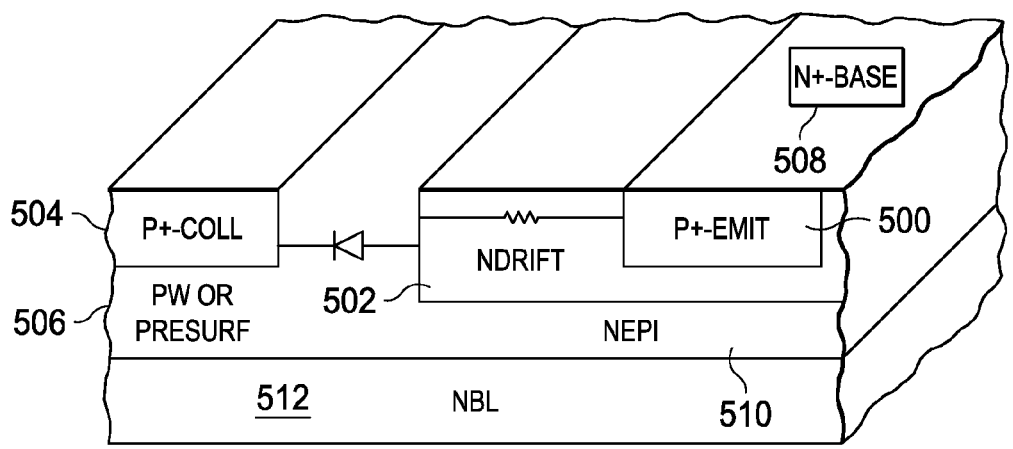
FIG. 5 is a depiction of a prior art lateral PNP and showing the forward path diode defined by the PNP.

The structure of FIG. 4 can be distinguished from the prior art lateral PNP shown in FIG. 3 in which there is no n-sinker epi tie. However, the n-sinker epi tie structure is best understood by comparing FIGS. 5 and 6, which show a prior art lateral PNP and one embodiment of a PNP of the invention, respectively. The prior art lateral PNP of FIG. 5 includes a p+ emitter 500 formed in an n-drift region or n-well 502 and spaced laterally from a p+ collector 504 formed in a p-well or p-Resurf region 506. An n+ base contact 508 is shown providing the base contact for the emitter finger 500. The n-drift 502 and p-well 506 are, in turn formed in an n-epitaxial region 510. An n-buried layer (NBL) 512 is formed below the n-epi 510.

The regions of the embodiment depicted in FIG. 6 are similar to the structure of FIG. 6 and similar structural elements are therefore depicted using the same reference numerals. However, in order to increase the efficiency of the reverse body diode formed by the p+ collector 504 and n-base contact island 508 (as depicted by the diode 600), an n-sinker 602 is formed that extends down into the n-epi 510 to the NBL 512. The sinker 602 is provided with an n+ contact region 604 that is connected to the n+ base contact 508 island. The diode 600 provides a current path for reverse current flow from the collector to the base.

Figure 8:
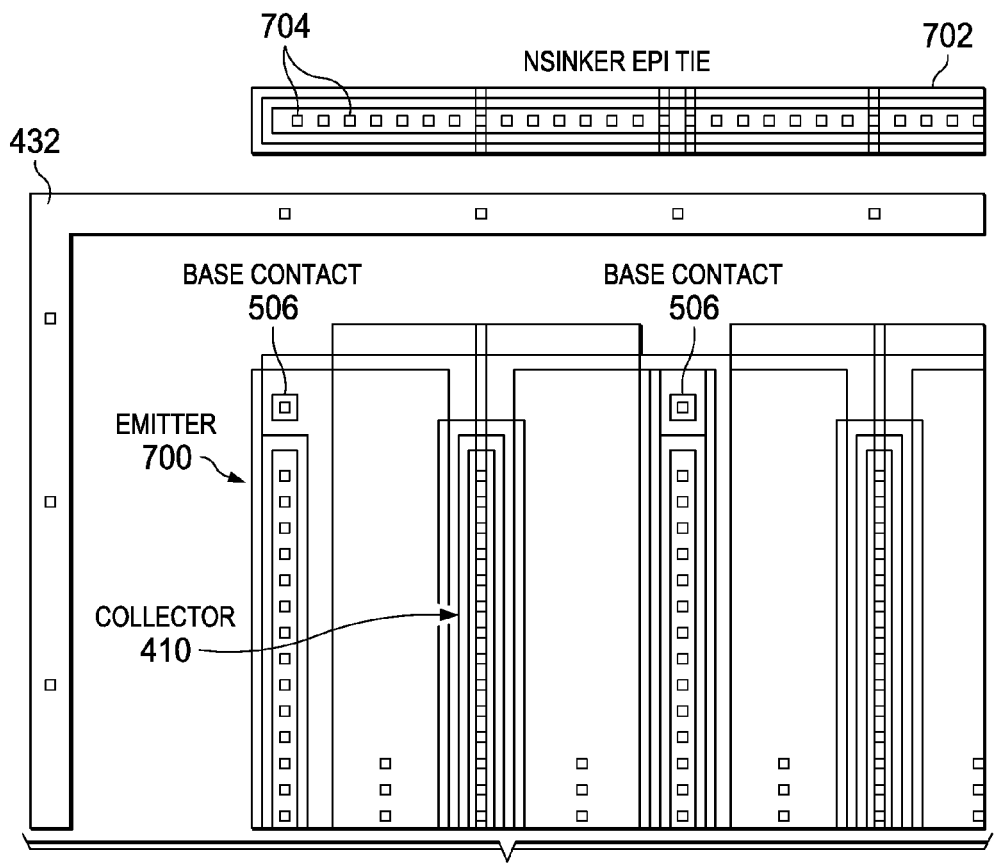
FIG. 8 shows a top view of a layout of a lateral PNP of the invention as in FIG. 7.

In another embodiment, which is illustrated in FIG. 7, the n+ base contact island for the emitter finger (finger n+ base contact) 508 is removed altogether and replaced by the n+ contact region 704 to the n-sinker 702, which defines a large n+ base contact region. In the top view layout of FIG. 8, the elimination of the finger n-base regions 508 is depicted by the removal of the n+ base contacts 508. The n-sinker epi tie 702 with its n+ contacts 704 is shown extending perpendicular to the emitter fingers 700 at one end of the lateral PNP emitter fingers.

Figure 9:
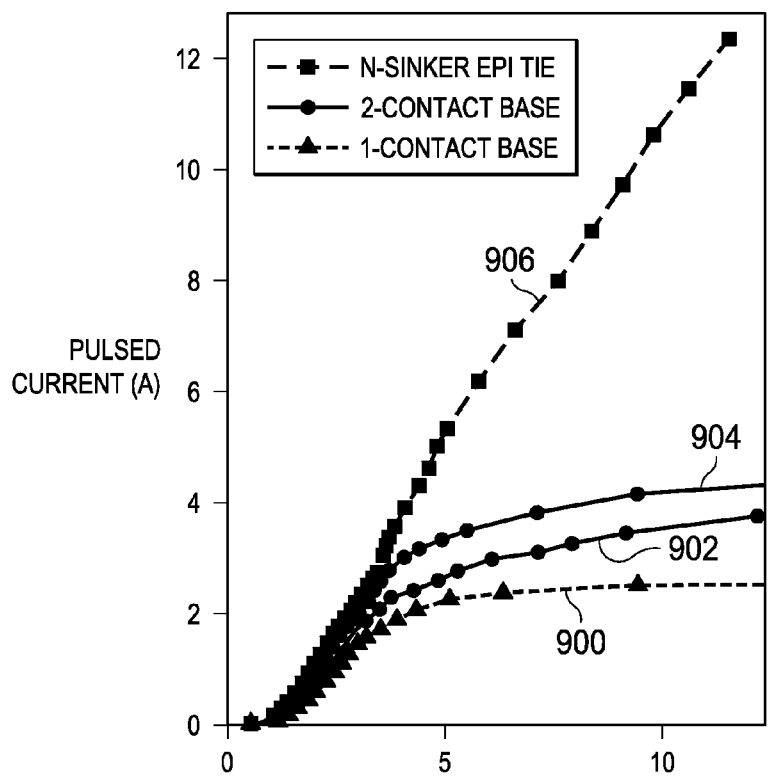
FIG. 9 shows current versus voltage curves for various embodiments of the invention compared to the prior art.

The effect of the strengthened base region through the use of a larger base contact region, additional base contact islands, or an n-sinker epi tie is shown in the current-voltage curves of FIG. 9. Curve 900 shows the prior art curve with no extra base region or base contact or an n-sinker epi tie, curve 902 shows the effect of an increased base contact island area, curve 904 shows the effect of using two base contact islands for each PNP device, and curve 906 shows the effect of an n-sinker epi tie, which has the most marked effect on increasing the reverse current robustness.

In the above embodiment a BCD process was discussed for a particular circuit involving adjacent high voltage pins. However the patent is not limited to this embodiment but could be used for lateral NPN structures with opposite doping type for the sinker and buried layer to the LPNP embodiment.

What is claimed is:

1. A lateral BJT clamp for protecting a high voltage pin that is arranged adjacent another high voltage pin, comprising:
   at least one collector finger,
   at least one emitter finger, wherein an enlarged base contact island is provided across at least part of the top end of said at least one emitter finger;
   a base,
   a buried layer of the same doping type as the base, and
   a sinker extending downward through an epitaxial layer of the same doping type of the base, down toward the buried layer, of the same doping type as the base, wherein:
      a) the sinker is provided with a contact region of the same doping type that is connected to the base contact island, and
      b) the contact region of the sinker and the enlarged base contact island of the at least one emitter finger are connected to one another,
   wherein an embedded reverse body diode provides a current path for a reverse current flow from the at least one collector finger to the base,
   wherein the reverse path body diode has an increased efficiency by increasing a base-contact area of the lateral BJT,
   wherein the reverse path body diode has an increased efficiency by increasing a base-contact area of the lateral BJT.

2. The lateral BJT clamp of claim 1, wherein the buried layer is a negative doped buried layer.

3. The lateral BJT clamp of claim 1, wherein the sinker is not interposed between the emitter finger and the collector finger.

4. A lateral BJT clamp for protecting a high voltage pin that is arranged adjacent another high voltage pin, comprising:
   at least one collector finger,
   at least one emitter finger, wherein an enlarged base contact island is provided across at least part of the top end of said at least one emitter finger;
   a base,
   a buried layer of the same doping type as the base, and
   a sinker extending downward through an epitaxial layer of the same doping type of the base, down toward the buried layer, of the same doping type as the base, but not beneath the base;
   wherein an embedded reverse body diode provides a current path for a reverse current flow from the at least one collector finger to the base,
   wherein the reverse path body diode has an increased efficiency by increasing a base-contact area of the lateral BJT,
   wherein the reverse path body diode has an increased efficiency by increasing a base-contact area of the lateral BJT.

5. The lateral BJT clamp of claim 4, wherein the buried layer is a negative-doped buried layer.

* * * * *